(12) United States Patent
Yuki et al.

(10) Patent No.: US 9,063,428 B2
(45) Date of Patent: Jun. 23, 2015

(54) METHOD FOR MANUFACTURING SEMICONDUCTOR DEVICE

(71) Applicant: Mitsubishi Electric Corporation, Tokyo (JP)

(72) Inventors: Hideaki Yuki, Tokyo (JP); Sunao Aya, Tokyo (JP); Shozo Shikama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/242,930

(22) Filed: Apr. 2, 2014

(65) Prior Publication Data

US 2014/0377709 A1  Dec. 25, 2014

(30) Foreign Application Priority Data

Jun. 20, 2013  (JP) .................................. 2013-129125

(51) Int. Cl.
*G03F 7/30*  (2006.01)

(52) U.S. Cl.
CPC ........................................ *G03F 7/30* (2013.01)

(58) Field of Classification Search
CPC ............ H01L 21/0273; H01L 21/0337; H01L 51/0018; G03F 7/0035; G03F 7/2022; G03F 7/00; G03F 7/2002; G03F 7/2024; G03F 7/203; G03F 7/30

USPC .......................................... 430/311, 322, 331
See application file for complete search history.

(56) References Cited

U.S. PATENT DOCUMENTS

| 5,681,762 A | * | 10/1997 | Baliga ........................... 438/173 |
| 5,821,035 A | | 10/1998 | Hirano et al. |
| 6,107,009 A | * | 8/2000 | Tan ................................. 430/331 |
| 6,352,818 B1 | * | 3/2002 | Hsieh ............................. 430/322 |

FOREIGN PATENT DOCUMENTS

| JP | 09-244258 A | 9/1997 |
| JP | 10-199791 A | 7/1998 |
| JP | 3708433 B2 | 8/2005 |
| JP | 2011-077120 A | 4/2011 |

* cited by examiner

*Primary Examiner* — Caleen Sullivan
(74) *Attorney, Agent, or Firm* — Studebaker & Brackett PC

(57) ABSTRACT

A method for manufacturing a semiconductor device of the present invention includes steps of (a) preparing a silicon carbide substrate including a photoresist film formed on a principal surface, (b) dropping a first developing solution onto the photoresist film, (c) rotating the silicon carbide substrate to drain the first developing solution dropped onto the photoresist film after a lapse of a first development time since the end of the step (b), (d) dropping a second developing solution onto the photoresist film after the step (c), and (e) rotating the silicon carbide substrate to drain the second developing solution dropped onto the photoresist film after a lapse of a second development time since the end of the step (d).

8 Claims, 4 Drawing Sheets

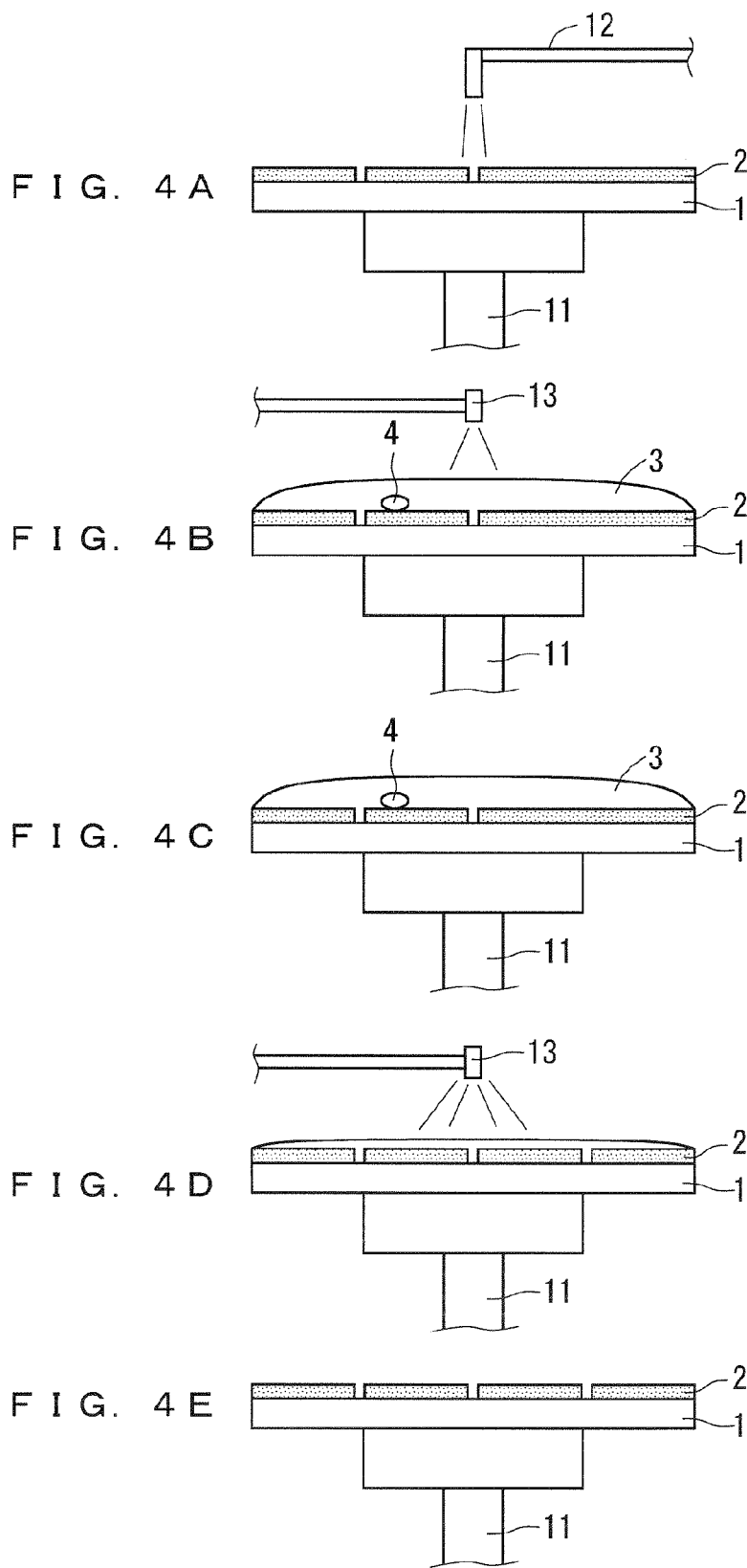

METHOD FOR MANUFACTURING SEMICONDUCTOR DEVICE

BACKGROUND OF THE INVENTION

1. Field of the Invention

The present invention relates to a development process in a method for manufacturing a semiconductor device.

2. Description of the Background Art

In the method for manufacturing the semiconductor device, a resist pattern formation that is an important microfabrication process is composed of steps below. (1) First, a photoresist (photosensitive material) film is applied to a surface of a semiconductor substrate. (2) Next, an ultraviolet exposure device prints a circuit pattern on the photoresist film with a use of a mask. (3) Lastly, a development process of the photoresist film is performed. These three steps form a resist pattern.

The development processing steps are composed of steps below. (1) First, the photoresist film on which the circuit pattern is printed is immersed in a developing solution. (2) Next, it is immersed in a development stopping solution (rinse solution) such as pure water, and the developing solution is replaced with the rinse solution to stop development. (3) Lastly, a wafer is rotated to drain the rinse solution to dry the wafer.

In the step (1) of immersing the photoresist film in the developing solution, the semiconductor substrate is often rotated after or while dropping the developing solution on the semiconductor substrate, to spread the developing solution entirely on the semiconductor substrate. At this time of dropping the developing solution, air might be taken in. Moreover, when nitrogen and the like apply pressure to the developing solution for dropping, the developing solution dropped on the semiconductor substrate returns to the atmospheric pressure, and then the nitrogen and the like dissolved in the developing solution during pressurization are foamed. Furthermore, in a case where the photoresist film is a positive-type photoresist film including a novolak resin, the nitrogen generated by a photosensitive reaction during exposure is taken into the photoresist film. Because of the multiple factors above, microbubbles (bubbles) are generated in the developing solution dropped onto the surface of the photoresist film. Some of the microbubbles adhere to the surface of the photoresist film. The adhered microbubbles prevent the developing solution from coming in contact with the photoresist film, thereby causing development defects. Thus, efficiency percentage of the semiconductor device is reduced.

As a method of removing the microbubbles, Japanese Patent No. 3708433 (2005), Japanese Patent Application Laid-Open No. 09-244258 (1997), and Japanese Patent Application Laid-Open No. 2011-77120 disclose that discharges of the development solution divided into multiple times are effective. In the method disclosed in Japanese Patent No. 3708433 (2005), first, while the semiconductor substrate is rotated at a velocity of 100 to 500 rpm, the developing solution is dropped on the semiconductor substrate for enhancing the surface wettability of the semiconductor substrate. Next, the developing solution is stopped to drop and the semiconductor substrate is rotated at a velocity of 500 to 1500 rpm. Lastly, while making the semiconductor substrate remain at rest or rotating it at a velocity of 100 rpm or less, the developing solution is dropped again to be puddled on the semiconductor substrate. Subsequently, the rinse solution is dropped on the semiconductor substrate and the developing solution is washed out.

Also, Japanese Patent Application Laid-Open No. 09-244258 (1997) discloses that the microbubbles, which are puddled on during a discharge of the developing solution for the first time to adhere to the surface of the photoresist film, can be removed by the discharge of the developing solution on the semiconductor substrate for the second and subsequent times. After discharging the developing solution to be puddled on the semiconductor substrate, the semiconductor substrate repeats high acceleration rotations and stops, whereby the microbubbles can also be removed.

Also, Japanese Patent Application Laid-Open No. 2011-77120 discloses the method of discharging the developing solution on the photoresist film again with an interval of the predetermined time after discharging the developing solution on the photoresist film. The second developing solution has a lower concentration than the first developing solution, so that the development is less advanced in the first development process than the second development process. Thus, the microbubbles can be removed effectively.

In the methods of Japanese Patent No. 3708433 (2005), Japanese Patent Application Laid-Open No. 09-244258 (1997), and Japanese Patent Application Laid-Open No. 2011-77120, the developing solution is discharged multiple times or the semiconductor substrate is rotated after the discharge of the developing solution, in order to move the microbubbles in contact with the surface of the photoresist film. These methods are capable of reducing the development defects caused by the microbubbles. However, it is required to reduce or eliminate the development defects more stably.

According to the method of Japanese Patent Application Laid-Open No. 2011-77120, it is necessary to prepare a plurality of developing solutions having various concentrations for a developing device, thereby increasing costs.

SUMMARY OF THE INVENTION

It is an object of the present invention to provide a method for manufacturing a semiconductor device capable of easily reducing development defects caused by microbubbles.

A method for manufacturing a semiconductor device of the present invention includes steps from (a) to (e). In a step (a), a semiconductor substrate including a photoresist film formed on a principal surface is prepared. In a step (b), the first developing solution is dropped onto the photoresist film. In a step (c), the semiconductor substrate is rotated to drain the first developing solution dropped onto the photoresist film after a lapse of the first development time since the end of the step (b). In a step (d), the second developing solution is dropped onto the photoresist film after the step (c). In a step (e), the semiconductor substrate is rotated to drain the second developing solution dropped onto the photoresist film after a lapse of the second development time since the end of the step (d).

The method for manufacturing a semiconductor device of the present invention includes the steps (c) and (d). In the step (c), the semiconductor substrate is rotated to drain the first developing solution dropped onto the photoresist film. In the step (d), the second developing solution is dropped onto the photoresist film after the step (c). Thus, the development process using the second developing solution is not influenced by microbubbles generated in the first developing solution. The probability is extremely low that the microbubbles occur in the same places on the photoresist film in the development process using the first developing solution and in the development process using the second developing solution. Therefore, development defects are reduced. Furthermore, it is not necessary to prepare a plurality of developing solutions having various concentrations.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 3A, 3B, 3C, 4A, 4B, 4C, 4D, and 4E are diagrams showing a development process for a photoresist film according to a second preferred embodiment.

DESCRIPTION OF THE PREFERRED EMBODIMENTS

<A. First Preferred Embodiment>
<A-1. Manufacturing Process>

Figure 1A:
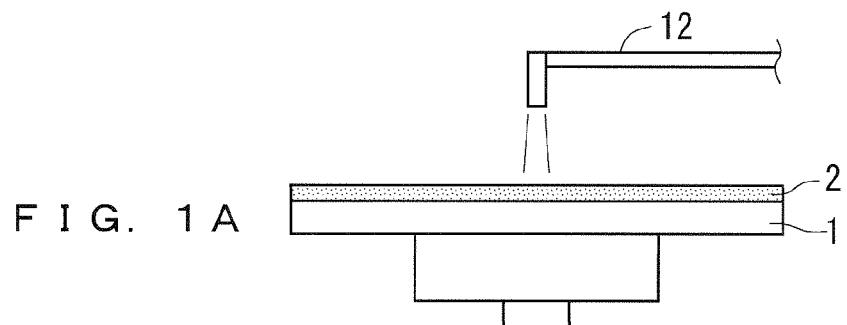
FIGS. 1A, 1B, 1C, 2A, 2B, 2C, and 2D are diagrams showing a development process for a photoresist film according to a first preferred embodiment.
Figure 1B:
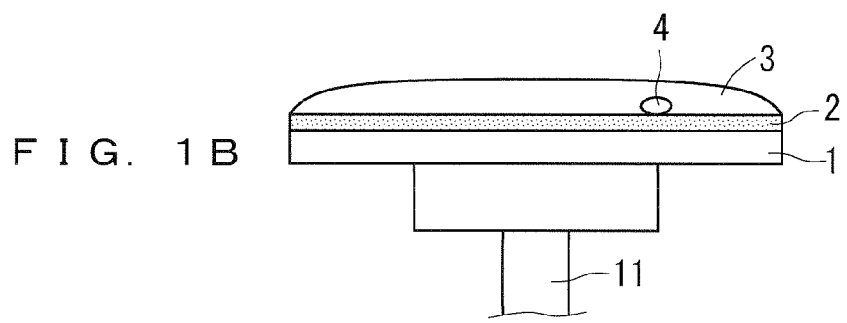
Figure 1C:
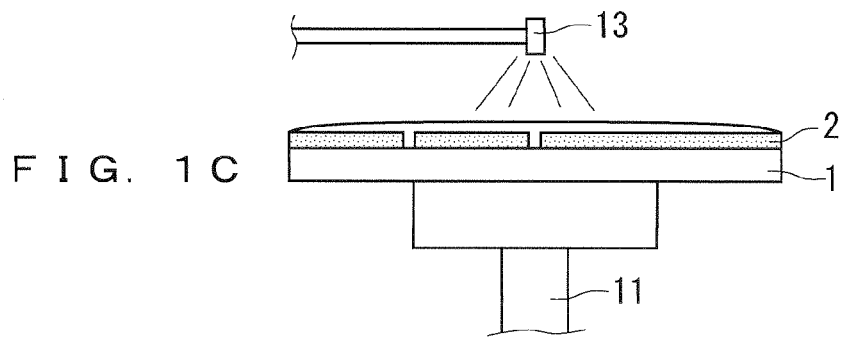

FIGS. 1A, 1B, 1C, 2A, 2B, 2C, and 2D are diagrams showing a development process of a photoresist film as a method for manufacturing a semiconductor device according to a first preferred embodiment. FIGS. 1A, 1B, and 1C show first development processing steps. FIGS. 2A, 2B, 2C, and 2D show second development processing steps performed subsequent to the first development processing steps. The development processing steps of the first preferred embodiment are described below with reference to FIGS. 1A, 1B, 1C, 2A, 2B, 2C, and 2D.

First of all, a silicon carbide substrate 1 exposing a photoresist film 2 is fixed to a wafer chuck 11, and a developing solution 3 is discharged from a developing solution discharging nozzle 12 onto the photoresist film 2 (FIG. 1A). The present invention is adequate for a silicon carbide semiconductor device in which high yields are desired in terms of a wafer cost. Thus, even if the silicon carbide substrate 1 is described in the following, another semiconductor substrate such as Si may be used.

FIG. 1B shows a state in which the developing solution 3 is puddled on the silicon carbide substrate 1. Dropping the developing solution 3 takes in air, which generates microbubbles 4. When nitrogen and the like apply pressure to the developing solution 3 for dropping, the developing solution 3 dropped onto the semiconductor substrate 1 returns to the atmospheric pressure, whereby the nitrogen dissolved in the developing solution 3 during pressurization are foamed to be the microbubbles 4. Furthermore, in a case where the photoresist film 2 is a positive-type photoresist film including a novolak resin, the nitrogen and the like generated by a photosensitive reaction during exposure is taken into the photoresist film 2, which becomes the factor in generating the microbubbles 4.

In the state of FIG. 1B, for example, the wafer chuck 11 is rotated at a velocity of 40 rpm for 0.1 second and it is rotated five times in total at live-second intervals, to thereby agitate the developing solution 3. This stepwise rotation can suppress the development defects caused by the microbubbles 4 which are not adhered to the surface of the photoresist film 2 and the relatively large microbubbles 4, and stabilize the finished shape of the photoresist film 2 within the surface of the silicon carbide substrate 1.

The state in which the developing solution 3 spreads on the surface of the photoresist film 2 is kept on waiting for the predetermined development time (the first development time). Meanwhile, the photoresist film 2 in contact with the developing solution 3 forms an opening according to an exposure pattern formed in advance. However, as shown in FIG. 1B, if the microbubbles 4 are formed on the surface of the photoresist film 2, development defects occur because the photoresist film 2 does not come in contact with the developing solution 3, allowing a region in need of openings to have no openings.

Next, while a rinse solution (for example, pure water) is discharged from a rinse solution discharging nozzle 13, the wafer chuck 11 is rotated to rotate the silicon carbide substrate 1 to drain the developing solution 3 (FIG. 1C). The rinse solution is discharged to drain the developing solution 3, thereby preventing the water-soluble developing solution 3 from becoming concentrated to greatly change a development condition and an uneven development from occurring within the surface of the silicon carbide substrate 1 due to the pattern arrangement.

Figure 2A:
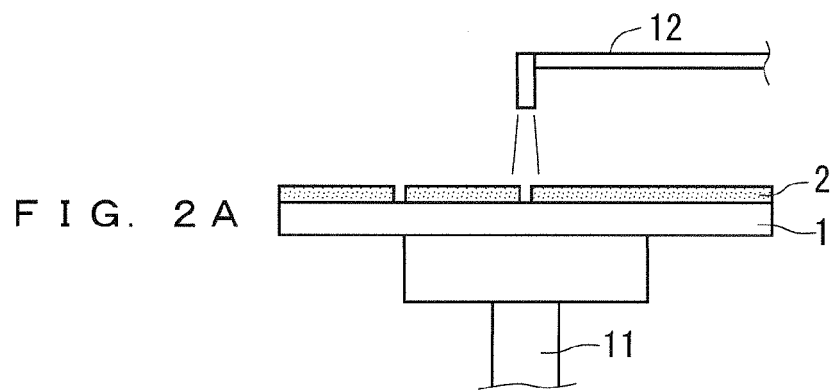
Figure 2B:
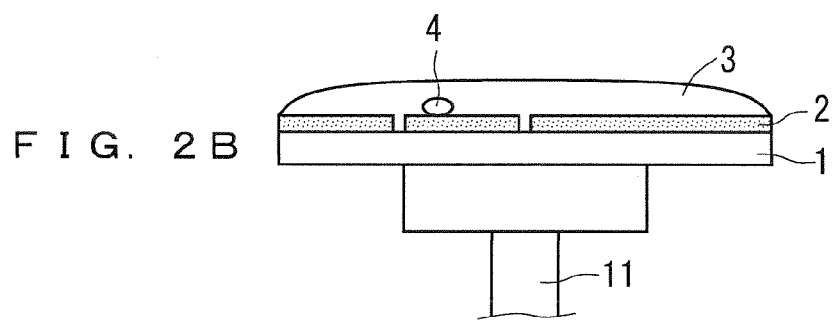

Then, the second development process is performed. The developing solution 3 is discharged again from the developing solution discharging nozzle 12 (FIG. 2A) to puddle the developing solution 3 on the silicon carbide substrate 1. Similarly to the first development process, while the developing solution 3 is puddled on the silicon carbide substrate 1, the silicon carbide substrate 1 is rotated stepwise to agitate the developing solution 3. Similarly to the first development process, the microbubbles 4 are generated on the surface of the photoresist film 2. However, the probability is extremely low that the microbubbles 4 are generated in the same place in the second development process as in the first development process. FIG. 2B shows that the microbubbles generated in the second development process are generated in the different place in the first development process. Therefore, the place where a development defect occurs in the first development process comes in contact with the developing solution 3 in the second development process to be patterned normally.

Preferably, the development time for the second time (the second development time) is set shorter than the development time for the first time (the first development time). The reason why is that the resist patterning on the silicon carbide substrate 1 is mostly performed in the first development process and the region to be patterned in the second development process is extremely small, allowing for the patterning in the shorter development time. As a result, while a change in the pattern formed in the photoresist film 2 in the first development process can be suppressed, development defects in the first development process can be eliminated.

Figure 2C:
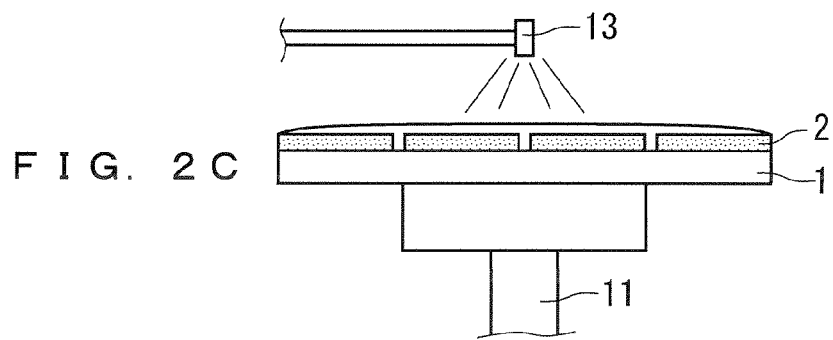

Next, while the rinse solution (for example, pure water) is discharged from the rinse solution discharging nozzle 13, the wafer chuck 11 is rotated to rotate the silicon carbide substrate 1 to drain the developing solution 3 (FIG. 2C). The rinse solution is discharged to drain the developing solution 3, thereby preventing the water-soluble developing solution 3 from becoming concentrated to greatly change a development condition and an uneven development from occurring within the surface of the silicon carbide substrate 1 due to the pattern arrangement.

Figure 2D:
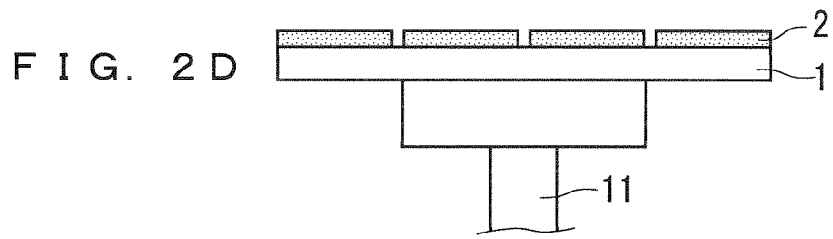

FIG. 2D shows the silicon carbide substrate 1 in which the second development process is completed. FIG. 2D shows that the photoresist film 2 directly below the microbubbles 4 generated in the first development process is finished with the patterning in the second development process.

The development process as described above is actually performed, which reduces to zero development defect per one substrate from approximately three in the first development process. In addition, the pattern of the photoresist film 2 is not changed because of the second development process. According to the development processing steps in the first preferred embodiment, even if the microbubbles 4 adhere to the photoresist film 2 and are not moved by the stepwise rotation during immersion in the development solution 3, the resist patterning can be performed without the influence because of the second development process. Therefore, development defects are reduced and efficiency percentage is enhanced.

The numerical value in the description of the present preferred embodiment is an example and a different numerical value may be used. The method for performing the development process twice is described above and the development process may be performed more than twice. The additional development process after draining the developing solution 3 is repeated multiple times, and thus the development defects can be further reduced. In this case, the development time for the third time and subsequent times is set shorter than the development time for the first time (the first development time), so that the pattern formed in the photoresist film 2 in the first development process is not changed as much as possible to be able to eliminate development defects.

<A-2. Effects>

The method for manufacturing the semiconductor device of the first preferred embodiment includes steps of (a) preparing the silicon carbide substrate 1 including the photoresist film 2 formed on the principal surface. (b) dropping the developing solution 3 (the first developing solution) onto the photoresist film 2, (c) rotating the silicon carbide substrate 1 to drain the developing solution 3 dropped onto the photoresist film 2 after a lapse of the first development time since the end of the step (b), (d) dropping the developing solution 3 (the second developing solution) onto the photoresist film 2 after the step (c), and (e) rotating the silicon carbide substrate 1 to drain the developing solution 3 dropped onto the photoresist film 2 after a lapse of the second development time since the end of the step (d). The second development process is performed after draining the developing solution 3 in the first development process, and thus the second development process is not influenced by the microbubbles 4 generated in the first development process. The probability is extremely low that the microbubbles 4 occur in the same places on the photoresist film 2 through the multiple development processes. Therefore, the development defects are reduced. Furthermore, it is not necessary to prepare a plurality of developing solutions having various concentrations.

The second development time is set shorter than the first development time. Thus, while a change in the pattern formed in the photoresist film 2 in the first development process can be suppressed, development defects in the first development process can be eliminated.

In the method for manufacturing the semiconductor device of the first preferred embodiment, in the step (c), while dropping the rinse solution onto the silicon carbide substrate 1, the silicon carbide substrate 1 is rotated to drain the first developing solution 3 dropped onto the photoresist film 2, and in the step (e), while dropping the rinse solution onto the silicon carbide substrate 1, the silicon carbide substrate 1 is rotated to drain the second developing solution 3 dropped onto the photoresist film 2. This prevents the water-soluble developing solution 3 from becoming concentrated to greatly change a development condition and the uneven development from occurring within the surface of the silicon carbide substrate 1 due to the pattern arrangement.

Moreover, the method for manufacturing the semiconductor device of the first preferred embodiment further includes steps of (f) rotating the silicon carbide substrate 1 stepwise between the steps (b) and (c), and (g) rotating the silicon carbide substrate 1 stepwise between the steps (d) and (e). Therefore, the development defects caused by the microbubbles 4 which are not adhered to the surface of the photoresist film 2 and the relatively large microbubbles 4 can be suppressed, and the finished shape of the photoresist film 2 within the surface of the silicon carbide substrate 1 can be stabilized.

Moreover, the method for manufacturing the semiconductor device of the first preferred embodiment further includes steps of (h) dropping the developing solution 3 (the third developing solution) onto the photoresist film 2 after the step (e), and (i) rotating the silicon carbide substrate 1 to drain the developing solution 3 dropped onto the photoresist film 2 after a lapse of the third development time since the end of the step (h). The development defects still remaining in the first and second development processing steps can be eliminated in the third development processing steps, so that the development defects can be further reduced.

The third development time is set shorter than the first development time. Thus, while a change in the pattern formed in the photoresist film 2 in the first development process can be suppressed, the development defects in the first and second development processes can be eliminated.

In the method for manufacturing the semiconductor device of the first preferred embodiment, in step (i), while dropping the rinse solution onto the silicon carbide substrate 1, the silicon carbide substrate 1 is rotated to drain the developing solution 3 (the third developing solution) dropped onto the photoresist film 2. This prevents the water-soluble developing solution 3 from becoming concentrated to greatly change a development condition and the uneven development from occurring within the surface of the silicon carbide substrate 1 due to the pattern arrangement.

The method for manufacturing the semiconductor device of the first preferred embodiment contributes to enhanced yields of the silicon carbide semiconductor device by using a silicon carbide semiconductor substrate for the silicon carbide substrate 1.

<B. Second Preferred Embodiment>

<B-1. Manufacturing Process>

Figure 3A:
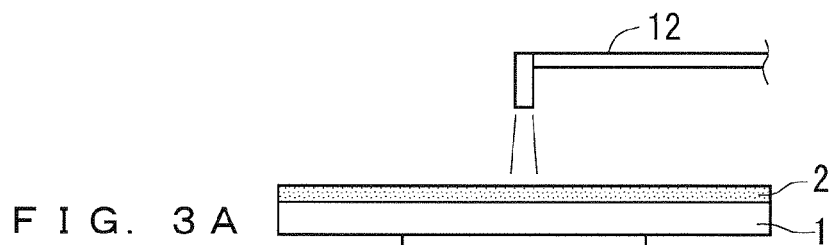
Figure 3B:
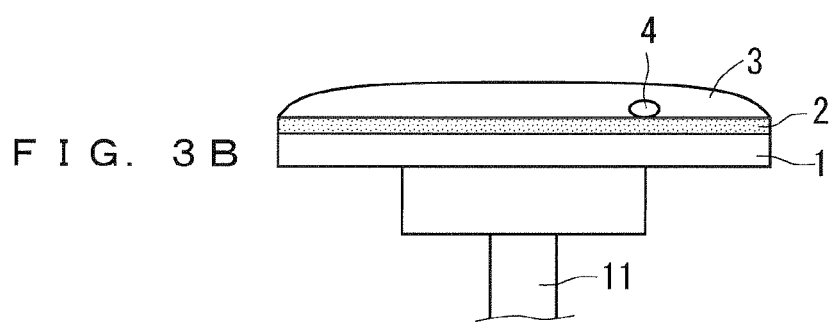
Figure 3C:
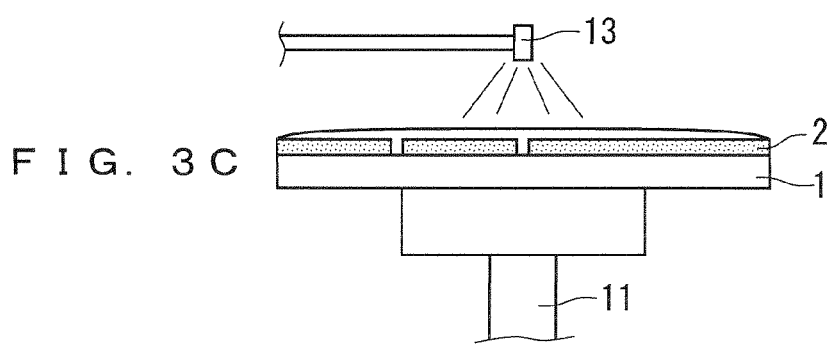

FIGS. 3A, 3B, 3C, 4A, 4B, 4C, and 4D are diagrams showing development processing steps of the photoresist film which are the method for manufacturing a semiconductor device according to a second preferred embodiment. FIGS. 3A, 3B, and 3C show the first development processing steps. FIGS. 4A, 4B, 4C, and 4D show the second development processing steps performed subsequent to the first development processing steps. The first development processing steps shown in FIGS. 3A, 3B, and 3C are similar to the first development processing steps of the first preferred embodiment shown in FIGS. 1A, 1B, and 1C, so the description is omitted. The second development processing steps shown in FIGS. 4A, 4B. 4C, and 4D are described below.

The second development process is performed subsequent to the first development process. The developing solution 3 is discharged again from the developing solution discharging nozzle 12 (FIG. 4A) to puddle the developing solution 3 on the silicon carbide substrate 1. Subsequently, as shown in FIG. 4B, while the developing solution 3 is puddled on the silicon carbide substrate 1, a proper amount of the rinse solution (for example, pure water) is discharged to reduce the concentration of the developing solution 3. Similarly to the first development process, the silicon carbide substrate 1 is rotated stepwise in this state to agitate the developing solution 3. Similarly to the first development process, the microbubbles 4 are generated on the surface of the photoresist film 2. However, the probability is extremely low that the microbubbles 4 are generated in the same place in the second development process as in the first development process. FIG.

4B shows that the microbubbles generated in the second development process are generated in the different place in the first development process. Therefore, the place where a development defect occurs in the first development process comes in contact with the developing solution 3 in the second development process to be patterned normally. Similarly to the first preferred embodiment, the second development time is set shorter than the first development time, and thus a change in the pattern of the photoresist film 2 formed in the first development process can be suppressed. The concentration of the developing solution 3 is reduced to further suppress the change in the pattern. Because the rinse solution changes the concentration of the developing solution 3, it is not necessary to prepare a plurality of developing solutions 3 having various concentrations in advance.

Next, while the rinse solution (for example, pure water) is discharged from the rinse solution discharging nozzle 13, the wafer chuck 11 is rotated to rotate the silicon carbide substrate 1 to drain the developing solution 3 (FIG. 4D). The rinse solution is discharged to drain the developing solution 3, thereby preventing the water-soluble developing solution 3 from becoming concentrated to greatly change a development condition and the uneven development from occurring within the surface of the silicon carbide substrate 1 due to the pattern arrangement.

FIG. 4E shows the silicon carbide substrate 1 in which the second development process is completed. FIG. 4E shows that the photoresist film 2 directly below the microbubbles 4 generated in the first development process is finished with the patterning in the second development process.

<B-2. Effects>

In the method for manufacturing the semiconductor device of the second preferred embodiment, after dropping the developing solution 3 (the second developing solution) onto the photoresist film 2, the rinse solution is dropped to reduce the concentration of the developing solution 3. Thus, while a change in the pattern formed in the photoresist film 2 in the first development process can be suppressed, development defects in the first development process can be eliminated. Because the rinse solution changes the concentration of the developing solution 3, it is not necessary to prepare a plurality of developing solutions 3 having various concentrations in advance.

In addition, according to the present invention, the above preferred embodiments can be arbitrarily combined, or each preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A method for manufacturing a semiconductor device, comprising the steps of:
    (a) preparing a semiconductor substrate including a photoresist film formed on a principal surface;
    (b) dropping a first developing solution onto said photoresist film;
    (c) rotating said semiconductor substrate to drain said first developing solution dropped onto said photoresist film after a lapse of a first development time since the end of said step (b);
    (d) dropping a second developing solution onto said photoresist film after said step (c); and
    (e) rotating said semiconductor substrate to drain said second developing solution dropped onto said photoresist film after a lapse of a second development time since the end of said step (d), wherein
    in said step (d), said second developing solution is dropped onto said photoresist film and then a rinse solution is dropped to reduce a concentration of said second developing solution, and
    the first and second developing solutions are dispensed at the same concentration.

2. The method for manufacturing a semiconductor device according to claim 1, wherein said second development time is shorter than said first development time.

3. The method for manufacturing a semiconductor device according to claim 1, wherein
    in said step (c), while dropping a rinse solution on said semiconductor substrate, said semiconductor substrate is rotated to drain said first developing solution dropped onto said photoresist film, and
    in said step (e), while dropping the rinse solution on said semiconductor substrate, said semiconductor substrate is rotated to drain said second developing solution dropped onto said photoresist film.

4. The method for manufacturing a semiconductor device according to claim 1, further comprising the steps of:
    (f) rotating said semiconductor substrate stepwise between said steps (b) and (c); and
    (g) rotating said semiconductor substrate stepwise between said steps (d) and (e).

5. The method for manufacturing a semiconductor device according to claim 1, further comprising the steps of:
    (h) dropping a third developing solution onto said photoresist film after said step (e); and
    (i) rotating said semiconductor substrate to drain said third developing solution dropped onto said photoresist film after a lapse of a third development time since the end of said step (h).

6. The method for manufacturing a semiconductor device according to claim 5, wherein said third development time is shorter than said first development time.

7. The method for manufacturing a semiconductor device according to claim 5, wherein
    in said step (i), while dropping a rinse solution on said semiconductor substrate, said semiconductor substrate is rotated to drain said third developing solution dropped onto said photoresist film.

8. The method for manufacturing a semiconductor device according to claim 1, wherein said semiconductor substrate is a silicon carbide substrate.

* * * * *